United States Patent
Ostendorf et al.

[11] Patent Number: 5,837,556
[45] Date of Patent: Nov. 17, 1998

[54] METHOD OF REMOVING A COMPONENT FROM A SUBSTRATE

[75] Inventors: Dennis R. Ostendorf, Rockford; Donald J. Geralds, Rochelle, both of Ill.

[73] Assignee: Sundstrand Corporation, Rockford, Ill.

[21] Appl. No.: 778,619

[22] Filed: Jan. 6, 1997

[51] Int. Cl.$^6$ ............................ H01L 21/58; H01L 21/68
[52] U.S. Cl. ........................ 438/4; 438/977; 29/264; 29/762; 29/764
[58] Field of Search ................. 438/4, 977, 434, 438/485; 156/344; 29/264, 762, 764

[56] References Cited

U.S. PATENT DOCUMENTS

| | | | |
|---|---|---|---|
| 405,559 | 6/1889 | Johansson | 384/610 |
| 931,069 | 8/1909 | Larrabee | 384/610 |
| 1,563,869 | 2/1925 | Larson | 384/610 |
| 1,964,470 | 6/1934 | King | 29/264 |
| 2,544,166 | 3/1951 | Limberger | 384/610 |
| 2,865,687 | 12/1958 | Bergmann | 384/610 |
| 3,311,433 | 3/1967 | Graham et al. | 384/610 |
| 3,915,784 | 10/1975 | Makhijani et al. | 156/344 |
| 4,009,423 | 2/1977 | Wilson | 361/385 |
| 4,012,832 | 3/1977 | Crane | 438/4 |
| 4,139,859 | 2/1979 | Lewis et al. | 357/72 |
| 4,237,086 | 12/1980 | Gehle | 264/130 |
| 4,242,157 | 12/1980 | Gehle | 156/64 |
| 4,265,498 | 5/1981 | Luce et al. | 384/610 |
| 4,336,568 | 6/1982 | Mitchell | 361/386 |
| 4,494,902 | 1/1985 | Kuppens et al. | 414/223 |
| 4,618,273 | 10/1986 | Gotz et al. | 384/610 |
| 4,826,553 | 5/1989 | Armitage et al. | 156/344 |
| 4,888,247 | 12/1989 | Zweben et al. | 428/105 |
| 4,897,508 | 1/1990 | Mahulikar et al. | 174/52.4 |
| 4,935,086 | 6/1990 | Baker et al. | 156/246 |
| 4,949,287 | 8/1990 | Schwab et al. | 29/764 |
| 4,985,989 | 1/1991 | Murphy | 29/764 |
| 5,014,001 | 5/1991 | Schmidt et al. | 324/158 F |
| 5,030,019 | 7/1991 | Stahlecker | 384/610 |
| 5,041,396 | 8/1991 | Valero | 438/4 |
| 5,111,280 | 5/1992 | Iversen | 357/82 |
| 5,137,836 | 8/1992 | Lam | 438/4 |
| 5,168,348 | 12/1992 | Chu et al. | 257/713 |
| 5,173,766 | 12/1992 | Long et al. | 257/687 |
| 5,178,957 | 1/1993 | Kolpe et al. | 428/458 |
| 5,193,269 | 3/1993 | Dattilo | 29/764 |
| 5,209,055 | 5/1993 | Hini et al. | 384/610 |
| 5,220,483 | 6/1993 | Scott | 361/313 |
| 5,260,505 | 11/1993 | Kendall | 84/298 |
| 5,273,615 | 12/1993 | Asetta et al. | 156/584 |
| 5,313,098 | 5/1994 | Tumpey et al. | 257/712 |
| 5,349,737 | 9/1994 | Long | 29/426.4 |
| 5,349,809 | 9/1994 | Stahlecker | 384/610 |
| 5,365,653 | 11/1994 | Padrun | 29/764 |
| 5,426,565 | 6/1995 | Anderson | 361/711 |
| 5,447,596 | 9/1995 | Hayase | 156/584 |

OTHER PUBLICATIONS

Technical Data Sheet "Ablefilm 506 Flexible Epoxy Adhesive Film," Ablestik, Rancho Dominguez, CA (Mar. 1991) No Date Available.

IBM Technical Disclosure Bulletin, IC Socket With IC Removal Mechanism, vol. 33, No. 10A, pp. 326–327, Mar. 1991.

*Primary Examiner*—David Graybill
*Attorney, Agent, or Firm*—Marshall, O'Toole, Gerstein, Murray & Borun

[57] ABSTRACT

A method of removing a component bonded to a substrate utilizes a fixture having a bore therethrough which is aligned with a bore in the substrate. A screw is advanced in the bore in the fixture to cause a push pin to contact the component and force the component away from the substrate.

15 Claims, 6 Drawing Sheets

METHOD OF REMOVING A COMPONENT FROM A SUBSTRATE

STATEMENT OF RIGHTS OWNED

This invention was made with government support under Prime Contract P7729254 awarded by the Department of the Army. The government has certain rights in this invention.

TECHNICAL FIELD

The present invention relates generally to removal methods, and more particularly, to a method of removing a first device or item, such as an electrical component, from a second device, such as a substrate.

BACKGROUND ART

Often, it is necessary to mount a component on a substrate or other device to accomplish a necessary or desirable function. This is particularly true where the component is subjected to unfavorable ambient conditions arising from outside influences and/or by operation of the component itself. In the case where a component must dissipate a significant amount of heat and survive wide environmental extremes, the component is bonded or otherwise secured to a heat sink substrate which transfers heat to a cooling fluid.

A coefficient of thermal expansion (CTE) mismatch between an electronic component and a mounting substrate can significantly reduce the life of the component. Substrates having a CTE similar to electrical components often have poor thermal properties, and cannot be readily adapted to contain cooling fluids. Further, it is difficult to find a mounting interface between the component and the substrate which will provide both good thermal contact (i.e., have sufficient compliance to overcome flatness variations in the materials) and easy attachment/removal. Finally, it is also difficult to find a substrate which has the stiffness needed to withstand harsh vibration environments, or which can have minimal deflections in the presence of cooling fluid pressures, and yet have low weight and favorable thermal properties.

One environment where the foregoing considerations arise is in an aircraft where solid state power controllers (SSPC's) are used. The SSPC's incorporate a number of electronic elements and are large (3.05 by 2.4 inches). Each SSPC includes a BeO (beryllium oxide) base bonded on an aluminum/silicon carbide metal matrix composite (MMC) heat sink by an adhesive, such as Ablefilm® 506 manufactured by Ablestik of Rancho Dominguez, Calif. The adhesive is composed of an epoxy matrix and glass fibers and provides: 1) low thermal resistance (owing to low void content); (2) the ability to comply to flatness variations in the components and substrate (leading to reduced mechanical stresses); (3) relatively short thermal path length; (4) adequate dielectric strength between the SSPC and the heat sink; and (5) good mechanical bond to survive the dynamic environment. Alternatively, a separate electrical insulating layer can be added to the assembly, and the adhesive can be replaced by a solder or other type of bond. Therefore, intimate thermal contact between the component and the heat sink can be maintained, while isolating the parts electrically, if necessary.

The metal matrix heat sink has a low CTE (coefficient of thermal expansion) which closely matches BeO to prevent bond failure due to thermal cycling and further provides increased stiffness in comparison to aluminum (without a weight penalty) which increases the natural frequency of the assembly. Further, MMC's can be manufactured which have integral heat transfer surfaces and mounting structures (i.e., walls, pins, fins, ribs, bosses, etc). In addition, MMC parts can be brazed/soldered/adhesive bonded to other MMC parts to form assemblies which can be made hermetically sealed or which can contain flowing fluids. Further, heat loads can be imposed on multiple surfaces of MMC's. One or more MMC parts may also be made into a chassis or motor housing to which electronics are mounted. MMC's are especially well-suited as a switched reluctance motor housing because a good CTE match can be achieved with the stator lamination and the housing and the magnetic properties of the laminations are not degraded thereby.

The BeO base of the SSPC is relatively fragile. Accordingly, removal of the SSPC from the MMC substrate for rework/repair without fracturing the substrate has proved to be difficult While the manufacturer of the adhesive notes that a bonded component can be removed by heating the component to 125 degrees C. and sliding a thin blade between the bonded surfaces, this technique has resulted in an unacceptably high incidence of damaged components. Heating the component to a substantially higher temperature to further soften the adhesive is not an option owing to the requirement that the electrical elements not be exposed to a temperature in excess of 150 degrees Celsius.

Baker et al., U.S. Pat. No. 4,935,086 discloses a process of bonding an integrated circuit package to the surface of a printed circuit board. This patent refers to the use of Ablefilm® 506 adhesive as "too strong to allow removal of the IC package without damaging the device." (Col. 1, Lines 31–36).

Gehle, U.S. Pat. No. 4,242,157 discloses a method of assembly of microwave integrated circuits having a structurally continuous ground plane. This patent references U.S. Pat. application Ser. No. 821,034, filed Aug. 1, 1977, which discloses "a releasable mounting for MIC's employing both mechanical fasteners and metal-filled epoxies."

SUMMARY OF THE INVENTION

A disassembly method permits a component to be removed from a substrate while minimizing the risk of damage thereto.

More particularly, in accordance with one aspect of the present invention, a method of disassembling a component from a substrate wherein the substrate includes a first bore and the component is releasably bonded to the substrate over the first bore includes the steps of providing a fixture for accepting the substrate wherein the fixture has a second bore and a pin in the bore and securing the substrate to the fixture such that the first bore is aligned with the second bore. A pin is pushed through the aligned bores into contact with the component and the pin is advanced against the component to force the component away from the substrate.

Preferably, the step of advancing the pin comprises the step of threading a screw to apply a force against the pin. Also preferably, the method includes the further step of supplying a ball bearing between the screw and the pin. Also, the step of securing the substrate may comprise the step of clamping the substrate to the fixture.

In accordance with the preferred embodiment, the fixture includes a plurality of further bores therethrough and a plurality of further pins are disposed in the plurality of further bores and the method includes the further step of moving the plurality of further pins in a certain sequence against the component. In addition, the step of moving may include the step of threading a screw against a ball bearing to apply a force against each further pin.

Still further, the component may be secured to the substrate by a bonding layer, preferably an adhesive, and the method may include the further step of heating the bonding layer to soften same.

In accordance with an alternative aspect of the present invention, a method of disassembling an electrical component from a substrate wherein the substrate includes a first plurality of bores and the electrical component is releasably bonded to the substrate over the first plurality of bores includes the steps of providing a fixture for accepting the substrate wherein the fixture has a second plurality of bores and securing the substrate to the fixture such that at least one of the first plurality of bores is aligned with one of the second plurality of bores to form at least one pair of aligned bores. A pin is inserted into each pair of aligned bores and a pusher member is inserted into each pair of aligned bores to force the pin therein into contact with the electrical component. Each pusher member is advanced to force the electrical component away from the substrate.

In accordance with yet another aspect of the present invention, a method of disassembling an electrical component from a substrate wherein the substrate includes a first plurality of bores and the electrical component is releasably bonded by an adhesive to the substrate over the first plurality of bores includes the steps of providing a fixture for accepting the substrate wherein the fixture has a second plurality of bores each which is threaded, securing the substrate to the fixture such that each of the first plurality of bores is aligned with one of the second plurality of bores to form pairs of aligned bores and inserting a pin into each pair of aligned bores. A ball bearing is inserted into each pair of aligned bores and a screw is threaded into each of the second plurality of bores to force the ball bearing against the pin therein and to force the pin into contact with the electrical component. The method includes the further step of continuing to thread each screw to cause the pin to force the electrical component away from the substrate.

Other features and advantages will become apparent from the specification appearing hereinafter and the drawings included herewith.

DESCRIPTION OF THE PREFERRED EMBODIMENTS

Figure 1:
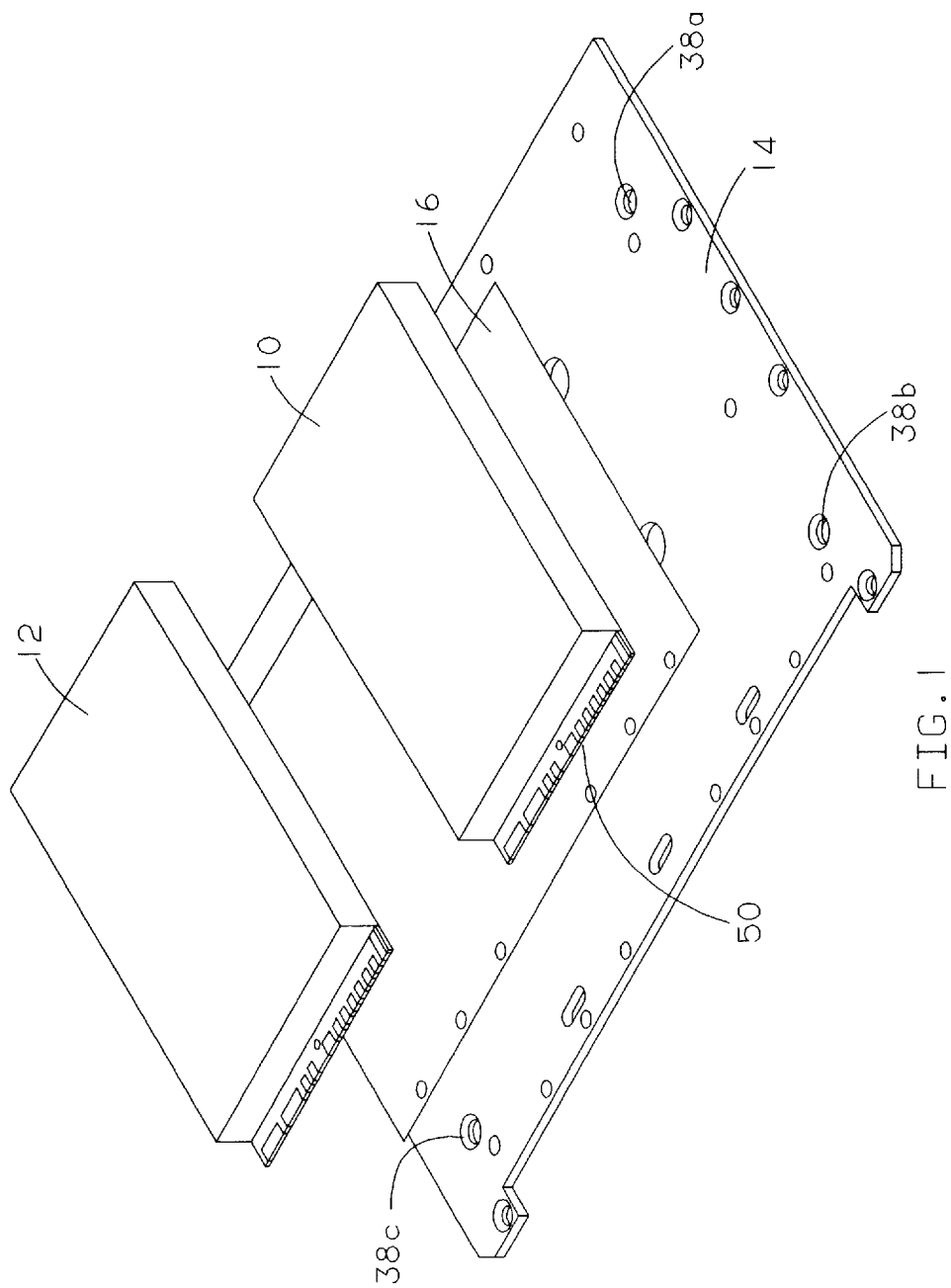
FIG. 1 comprises an exploded isometric view of a pair of SSPC's in conjunction with an MMC substrate.

Referring now to FIG. 1, at least one, and preferably two SSPC's 10, 12 are bonded by a bonding agent to a heat sink substrate 14. Preferably, the substrate 14 comprises a single piece of metal matrix composite material. According to a specific embodiment, the substrate is made of an aluminum silicon carbide metal matrix material sold by Lanxide Electronic Components, L.P. of Newark, Del. under the trademark MCX-693®. Also preferably, the bonding agent comprises at least one, and preferably two, layers 16 of a suitable adhesive, such as the Ablefilm® 506 adhesive identified above. One layer 16 is preferably applied to the substrate 14 while the other layer 16 is preferably applied to a beryllium oxide base 18 (FIG. 6) of each SSPC 10, 12. As noted in greater detail hereinafter, the use of two layers of adhesive simplifies later removal of the SSPC's 10, 12 from the substrate 14 by providing an interface between the layers 16 at which separation can occur. Other advantages are also obtained by this arrangement as also described below.

Figure 2:
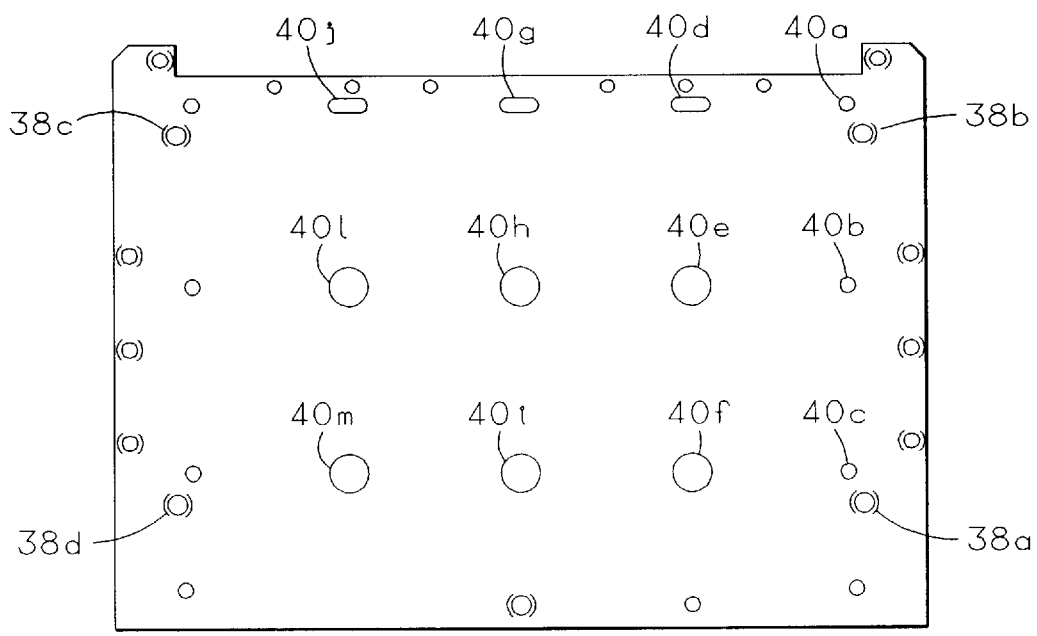
FIG. 2, comprises a bottom elevational view of the substrate of FIG. 1.
Figure 3:
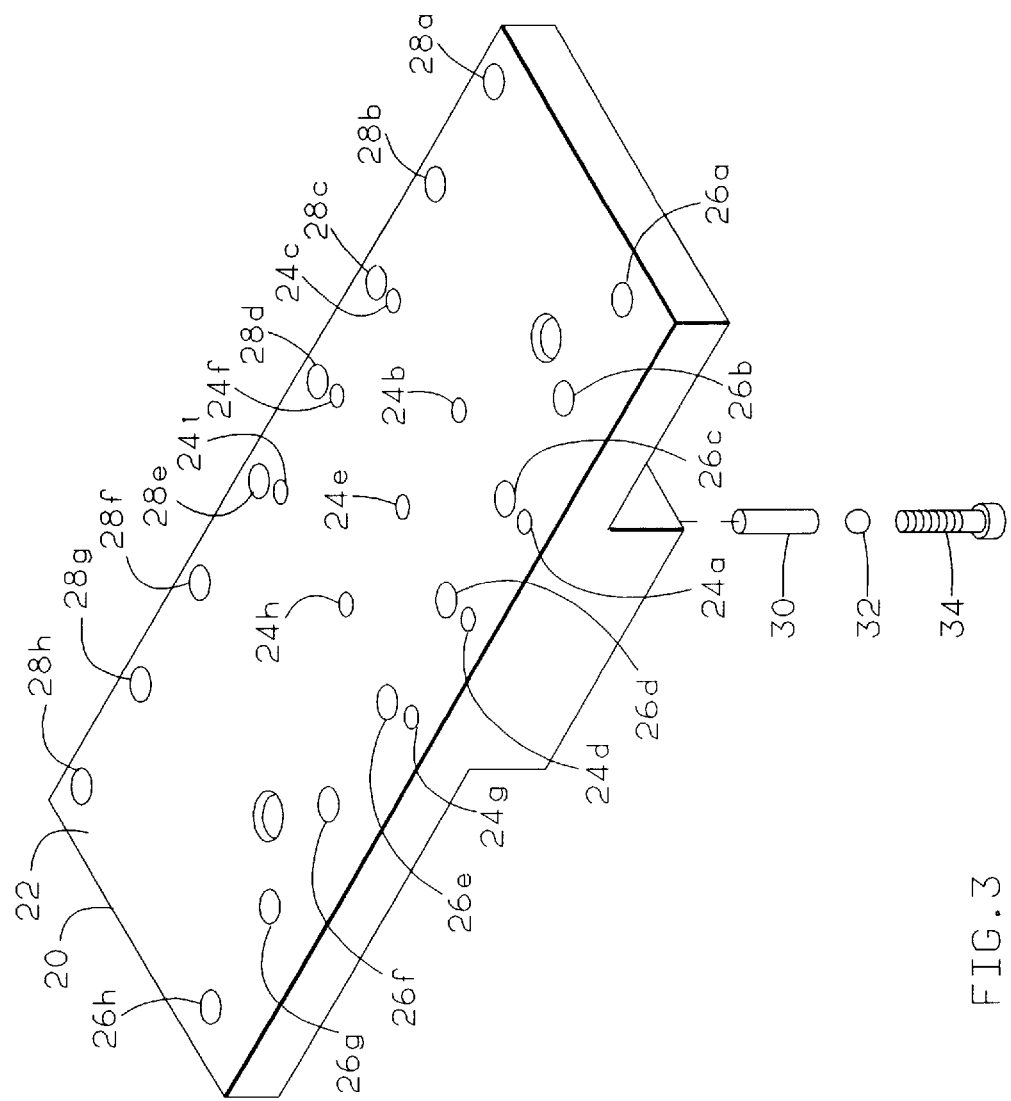
FIG. 3 comprises an isometric view of a fixture useful in the method of the present invention.
Figure 4:
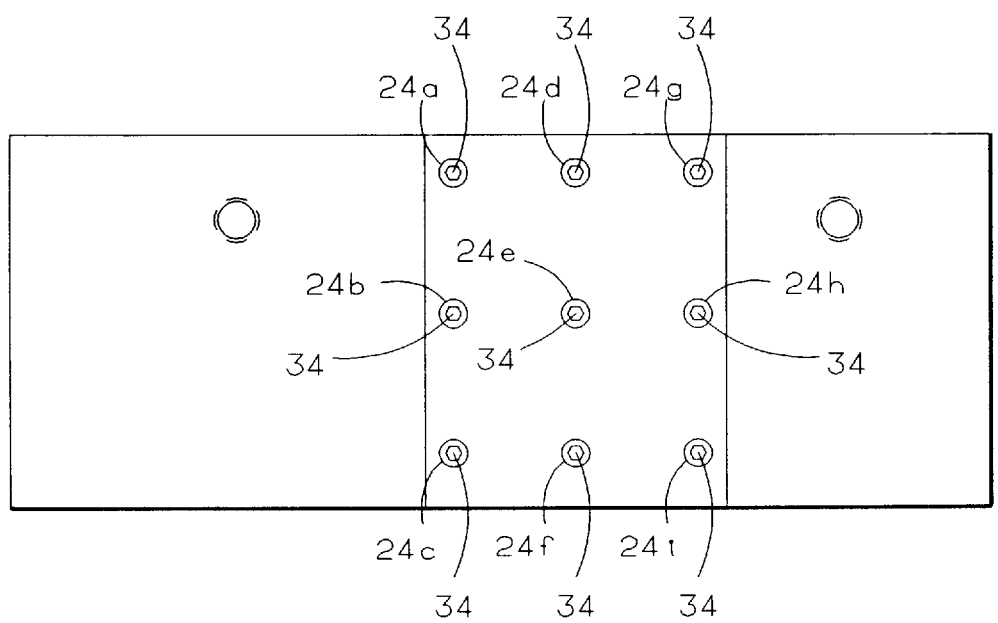
FIG. 4 comprises a bottom elevational view of the fixture of FIG. 3.
Figure 5:
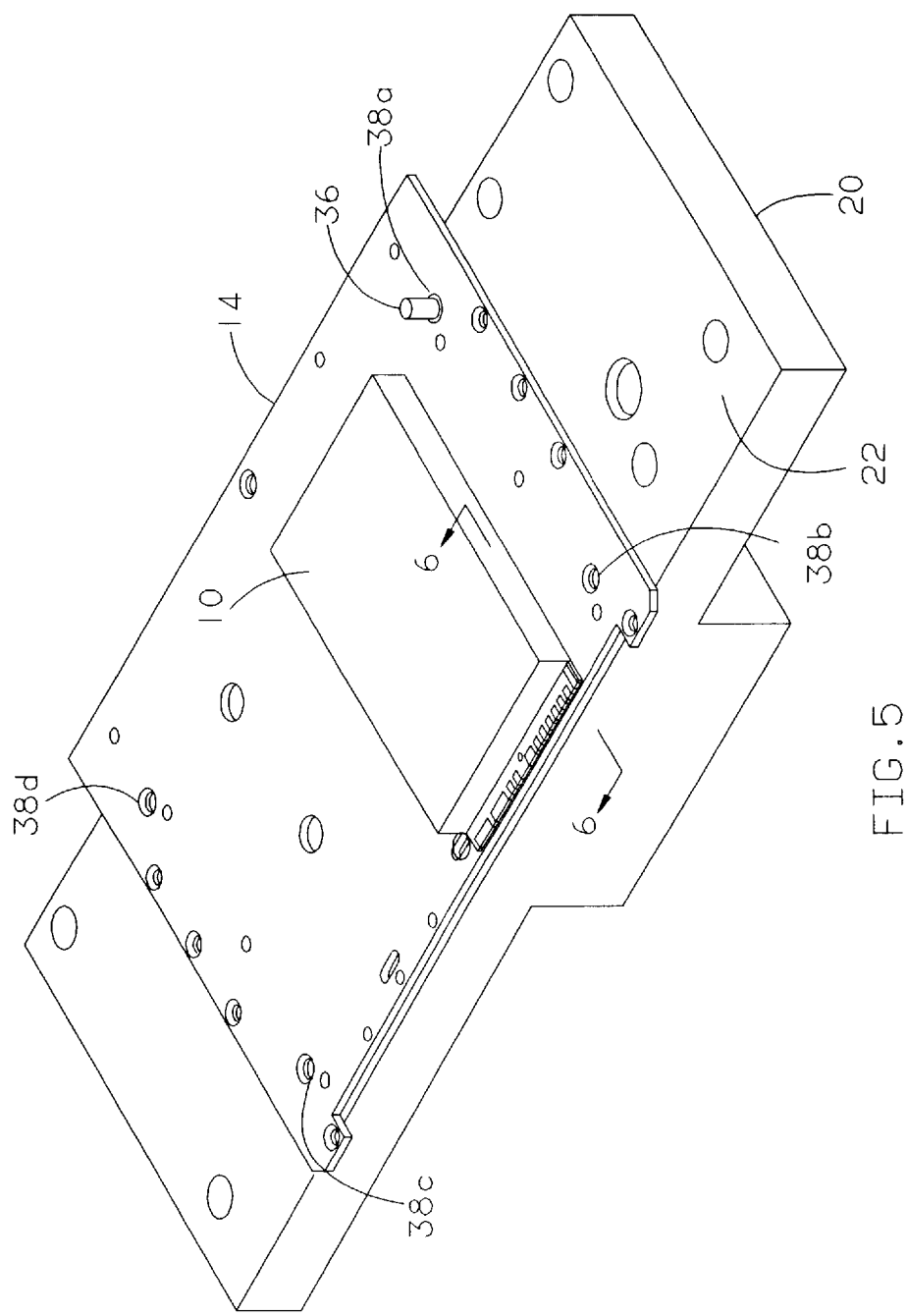
FIG. 5 comprises a fragmentary isometric view of one of the SSPC's bonded to the substrate of FIG. 1 wherein the latter is disposed on the fixture of FIG. 3.

It should be noted that the present invention is not limited to use with the assembly of FIG. 1, but instead finds utility with any other assembly in which a component of any kind is secured by any type of bonding agent (whether or not an adhesive) to a substrate FIG. 3 illustrates a fixture 20 having a first face 22 which is adapted to receive the substrate 14 as seen in FIG. 5 when one or both of the SSPC's are to be removed from the substrate 14 (only the SSPC 10 is shown in FIG. 5 for the sake of clarity). The fixture 20 includes a plurality of threaded bores 24a–24i extending fully therethrough. Preferably, each of the threaded bores 24a–24d and 24f–24i receives a push pin 30, a ball bearing 32 and a threaded hex head cap screw 34 (one of each of which is seen in FIG. 3). (Use of the threaded bores 24e and 24f in the present method is optional, in which case a push pin 30, a ball bearing 32 and a screw 34 would be disposed in each bore that is to be used.) The push pins 30 in the bores 24a, 24d and 24g are all of a first length, the push pins 30 in the bores 24b, 24e (if used) and 24h are all of a second length and the push pins in the bores 24c, 24f (if used) and 24i are all of a third length. In the preferred embodiment, the first length is greater than the second length and the second length is greater than the third length. Alternatively, all of the push pins 30 may be of the same or different lengths, as may be the screws 34. Locating holes 26a–26h and 28a–28h extend at least partially through the fixture and one or more of the holes 26c, 26g and 28c, 28h may receive locating pins 36 (one of which is seen in FIG. 5) extending through one or more of a plurality of holes 38a–38d in the substrate 14 when the substrate is disposed on and properly aligned with the fixture 20 (see also FIGS. 1 and 2). Once the substrate 14 is properly aligned, the bores 24 align with holes 40a–40i in the substrate 14 (FIG. 2). Alignment can be facilitated by threading the screws 34 until each pusher pin 30 extends above the face 22 a small amount, such as 1/32nd inch. Thereafter, the substrate 14 can be placed on the face 22 and shifted in position until the pusher pins enter the holes 40a–40i. Once alignment has been confirmed (for example, visually), the substrate 14 is temporarily secured to the fixture 20 by any suitable means, such as by C-clamps (not shown). It may be necessary to place a blank plate over the adjacent SSPC 12 to provide a surface to clamp to without damaging the SSPC 12.

If the SSPC 12 is to be removed instead, the holes 38a–38d are aligned with the locating holes 26a, 26e and 28a, 28e and one or more locating pins may be inserted into the aligned holes. In this position, the bores 24a–24i are aligned with holes 40g–40m, respectively.

Figure 6:
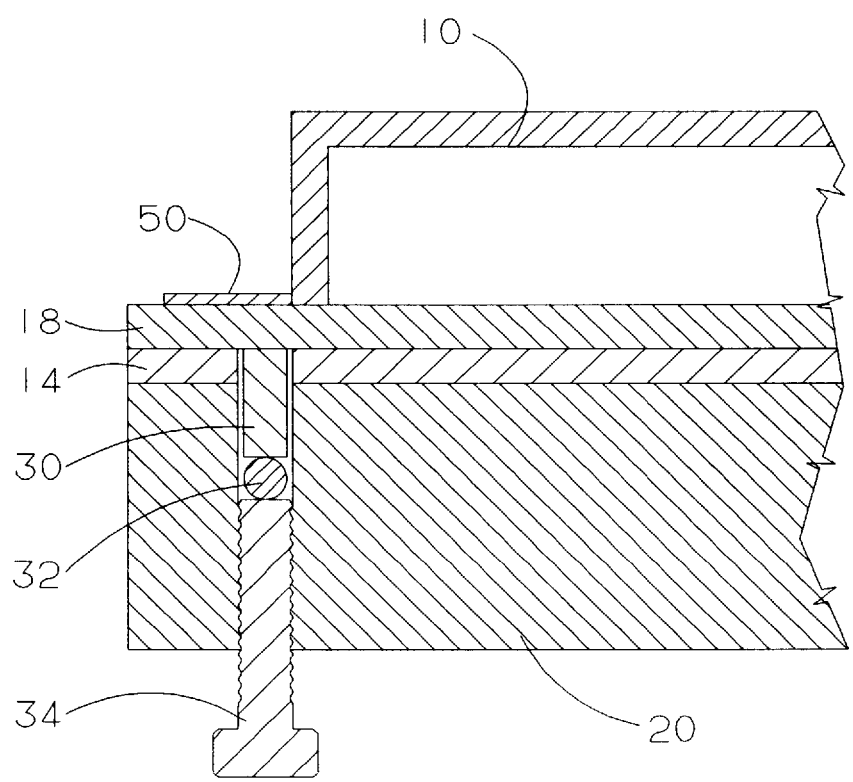
FIG. 6 comprises a fragmentary sectional view taken generally along the lines 6—6 of FIG. 5.

The next step in the removal process is to finger tighten the screws 34 in the bores 24a–24i (if the push pins are not already in contact with the base 18 of the SSPC 10) and place the entire assembly in an oven at 125 degrees Celsius. The assembly is allowed to heat until it has reached oven temperature (typically one hour). The assembly is then removed from the oven and a torque (preferably, although not necessarily, 4 inch-ounces) is applied to each of the screws 34. Preferably, the screws are tightened in a particular sequence such that the screws 34 in the bores 24a, 24d and 24g are torqued first, the screws 34 in the bores 24b, 24e (if used) and 24h are torqued next and the screws 34 in the bores 24c, 24f (if used) and 24i are torqued last. As seen in FIG. 6., the screws 34 are in contact with the ball bearings 32 and the latter prevent substantial transmission of torque to the push pins. 30. Thus, the push pins 30 do not rotate, and hence do not dig into the base 18 of the SSPC 10. The screws 34 are then repeatedly retorqued in the particular sequence for a period of time, for example for a total period equal to approximately five minutes. Care should be taken to retorque by small amounts and only until each screw begins to turn so that damage to the SSPC 10 is avoided. The assembly is then placed back in the oven until it again reaches 125 degrees Celsius (approximately 15 minutes). The assembly is then removed from the oven and torque is again applied to the screws in the particular sequence and for the time described above. This process is repeated until the adhesive eventually relaxes and allows the SSPC 10 to be peeled from the substrate 14. Once the screws 34 in the bores 24a, 24d and 24g start turning easily pressure should be maintained by the remaining screws 34 to avoid damaging the base 18. The adhesive is thereafter removed from the heat sink and the component is repaired and reassembled.

The foregoing process according to the present invention results in pivoting of the SSPC about a rear edge thereof to prevent damage to a connector portion 50 (FIG. 1). The torque that is applied is sufficient to break the bond between the SSPC and the heat sink but is not sufficient to crack the base of the component. Two layers of adhesive are used to: (1) increase the likelihood that the break line will be between adhesive layers (which will decrease the amount of required rework to the SSPC); (2) improve the dielectric strength by increasing the distance between the base of the SSPC and the heat sink substrate; and (3) decrease the number of air voids, and thus improve thermal and dielectric performance.

It should be noted that the number and positions of the bores 34 may vary from that shown and still be within the scope of the present invention. For example, six bores 24 may alternatively be provided in the fixture 20 to permit removal of an SSPC smaller than that shown in the Figs. Further, a different number of SSPC's may be disposed on the substrate 14, in which case the spacing of the various bores and holes may be varied to accommodate same. In addition, the timing and duration of heating periods may be varied as necessary to keep the bonding agent soft during the time that the screws 34 are torqued.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. The details of the structure may be varied substantially without departing from the spirit of the invention, and the exclusive use of all modifications which come within the scope of the appended claims is reserved.

We claim:

1. A method of disassembling an electrical component from a substrate wherein the substrate includes a first bore and the component is releasably bonded to a first face of the substrate over the first bore, the method comprising the steps of:

providing a fixture for accepting the substrate wherein the fixture has a second bore and a pin in the bore;

securing a second face of the substrate opposing its first face to the fixture such that the first bore is aligned with the second bore;

pushing the pin through the aligned bores into contact with the component; and advancing the pin against the component to force the component away from the substrate.

2. The method of claim 1, wherein the step of advancing the pin comprises the step of screwing a screw to apply a force against the pin.

3. The method of claim 2, including the further step of supplying a ball bearing between the screw and the pin.

4. The method of claim 1, wherein the step of securing the substrate comprises the step of clamping the substrate to the fixture.

5. The method of claim 1, wherein the fixture includes a plurality of further bores therethrough and wherein a plurality of further pins are disposed in the plurality of further bores and including the additional step of moving the plurality of further pins against the component.

6. The method of claim 5, wherein the step of moving includes the step of screwing a screw against a ball bearing to apply a force against each further pin.

7. The method of claim 1, wherein the component is secured to the substrate by a bonding layer and including the further step of heating the bonding layer to soften same.

8. The method of claim 7, wherein the bonding layer comprises an adhesive.

9. A method of disassembling an electrical component from a substrate wherein the substrate includes a first plurality of bores and the electrical component is releasably bonded to the substrate over the first plurality of bores, the method comprising the steps of:

providing a fixture for accepting the substrate wherein the fixture has a second plurality of bores;

securing the substrate to the fixture such that at least one of the first plurality of bores is aligned with one of the second plurality of bores to form at least one pair of aligned bores;

inserting a pin into each pair of aligned bores;

inserting a pusher member into each pair of aligned bores to force the pin therein into contact with the electrical component; and advancing each pusher member to force the electrical component away from the substrate.

10. The method of claim 9, including the further step of placing a ball bearing into each pair of aligned bores between the pin and the pusher member.

11. The method of claim 10, wherein at least one of the bores of each aligned pair of bores is threaded and the pusher member comprises a screw and wherein the step of advancing comprises the step of screwing each screw into a threaded bore.

12. The method of claim 11, wherein there are at least two screws in at least two threaded bores and the step of advancing comprises the step of screwing the screws into the threaded bores.

13. The method of claim 12, wherein the electrical component is secured by a plurality of layers of an adhesive to the substrate and further including the step of heating the adhesive layers to soften same before the advancing step.

14. A method of disassembling an electrical component from a substrate wherein the substrate includes a first plurality of bores and the electrical component is releasably bonded by an adhesive to the substrate over the first plurality of bores, the method comprising the steps of:

providing a fixture for accepting the substrate wherein the fixture has a second plurality of bores each which is threaded;

securing the substrate to the fixture such that each of the first plurality of bores is aligned with one of the second plurality of bores to form pairs of aligned bores;

inserting a pin into each pair of aligned bores;

inserting a ball bearing into each pair of aligned bores;

screwing a screw into each of the second plurality of bores to force the ball bearing against the pin therein and to force the pin into contact with the electrical component; and continuing to screw each screw to cause the pin to force the electrical component away from the substrate.

15. The method of claim 14, wherein the electrical component is secured by two layers of adhesive to the substrate and further including the step of heating the layers of adhesive to soften same.

* * * * *